United States Patent [19]

Fassino

[11] 4,028,505

[45] June 7, 1977

[54] NEGATIVE IMPEDANCE REPEATER FOR TELEPHONE LINES

[76] Inventor: Lorenzo Fassino, Via Piedicavallo 32, Turin, Italy

[22] Filed: Oct. 6, 1975

[21] Appl. No.: 619,905

Related U.S. Application Data

[63] Continuation-in-part of Ser. No. 441,369, Feb. 11, 1974, abandoned.

[30] Foreign Application Priority Data

Mar. 12, 1973   Italy ................................. 67674/73

[52] U.S. Cl. ............................................. 179/170 G
[51] Int. Cl.[2] ........................ H04B 3/36; H04B 3/16
[58] Field of Search .................... 179/170 R, 170 G; 330/61 A; 333/28 R, 80 R, 80 T

[56] References Cited

UNITED STATES PATENTS

| | | | |
|---|---|---|---|
| 2,855,575 | 10/1958 | Tamburelli | 179/170 G |
| 2,998,581 | 8/1961 | Dimmer | 179/170 G |
| 3,024,324 | 3/1962 | Dimmer | 179/170 G |
| 3,042,759 | 7/1962 | Bonner | 179/170 G |
| 3,551,838 | 12/1970 | Valfre | 179/170 G |
| 3,684,975 | 8/1972 | Valfre | 179/170 G |
| 3,814,866 | 6/1974 | Japenga | 179/170 G |
| 3,860,767 | 1/1975 | Boucher et al. | 179/170 G |
| 3,867,589 | 2/1975 | Junek | 179/170 G |
| 3,927,280 | 12/1975 | Gupta et al. | 179/170 G |

*Primary Examiner*—Kathleen H. Claffy
*Assistant Examiner*—Randall P. Myers

[57] ABSTRACT

A negative impedance repeater for amplification in telephone lines operating at voice frequency comprises two converters, one of them stable with open terminals and the other stable with short-circuited terminals; each converter is loaded by a fixed network of passive impedances chosen according to the characteristic impedance of the line to be amplified, and provided with means, external to the network of passive impedances, for adjusting the feedback, and consequently the conversion ratio. The conversion ratios of the two converters may be varied independently from each other so that in the case of loaded lines their product may be kept always constant and this allows to adjust the repeater gain without modifying its impedance, while for unloaded lines it is possible to obtain that such product increases with a certain law by increasing gain, and this fact causes an equalization at the highest frequencies of the band, which is necessary for this type of lines.

3 Claims, 5 Drawing Figures

NEGATIVE IMPEDANCE REPEATER FOR TELEPHONE LINES

This application is a continuation-in-part application of co-pending application Ser. No. 441,369, filed on Feb. 11, 1974, now abandoned.

This invention relates to a negative impedance repeater for amplification in telephone lines operating at voice frequency.

The devices at present in use for this end generally comprise a negative impedance converter, of the type stable with open terminals, called "series converter", and a negative impedance converter of the type stable with short-circuited terminals, called "shunt converter," connected in a "bridge" arrangement. The negative impedance converters are electric circuits having four terminals, two of which, called "output terminals", are loaded by passive impedances which appear to the two other terminals, called "input terminals", changed in sign and multiplied by a factor called "conversion ratio."

The repeaters must be accurately matched to the impedance of the transmission line in which they are employed, at least in the selected operating band; also the gain must be adjusted according to the characteristics of the line.

At present two methods are used in order to obtain such a matching.

The first method consists in realizing such repeaters by means of negative impedance converters loaded by passive impedances which appear at the input change in sign and divided by the "conversion ratio."

These networks of load impedances may be varied at will in the various cases used so as to obtain the required combination of impedance matching and gain.

The second method consists in changing, by means of passive matching networks, external to the repeater, the impedance of the various transmission lines so as to bring it to a predetermined value having if possible phase angle zero, i.e., so that it becomes a mere resistance.

In this way the repeater is automatically matched, provided that it has at its terminals a resistive impedance of the same value as said resistance. This is obtained by loading the converters forming the repeater by two resistors.

By such an arrangement, at the installation it is sufficient to adjust the gain of the repeater, by varying the two load resistors of the converters.

The first aforesaid method, even if it is very versatile since it is suitable for every kind of loaded and unloaded transmission line, requires rather complicated operations for setting up the networks of load impedances of the negative impedance converters, due to the interdependence between gain and matching.

These operations require a lot of time and very skilled labor, and thereby make very expensive the installation of repeaters.

The second method does not give rise to difficulties of installation, but its practical employ is restricted to the loaded transmission lines, since only with these lines it is possible to realize a passive matching network which is simple enough, introduces low attenuation and disequalization and may be easily set up. Another drawback of this method is that the capacitance introduced in parallel with the telephone line is always high, in that its value results from adding the capacitances existing in the matching networks connected between the repeater and the line, to the blocking capacitances for the direct current connected in the shunt converter. Since the blocking capacitances have a value which is approximately the maximum bearable value for an acceptable distortion of the d.c. signalling pulses, it is self evident that, by inserting matching networks, of the type at present in use, between the line and the repeater, other capacitances are added, thereby increasing the pulse distortion.

The object of the present invention is to provide a negative impedance repeater which may be readily set up at the installation and allows to obviate the aforesaid drawbacks.

The repeater according to the invention is essentially characterized in that it comprises a series converter and a shunt converter, each one provided with networks of fixed load impedances, chosen on the basis of the impedance characteristics of the line to be amplified, and with means for adjusting the (positive or negative) feedback and consequently the conversion ratios. Said regulation means serve to change the repeater gain, while the passive impedances of load of the converters give the impedance matching. For loaded lines the regulations shall be such that the product of the two conversion ratios remains constant for all of the regulation range and for all the frequencies of the transmitted band, and in this way the gain regulation does not affect the repeater impedance.

For non-loaded lines the regulations shall be such that the product of the two conversion ratios increases with increasing repeater gain, due to the fact that the conversion ratio of the shunt converter increases more quickly than the conversion ratio of the series converter decreases, and this in order to obtain a greater increase of the gain at the higher frequencies of the band, which increase is necessary for this type of lines; in fact the non-loaded lines have the load impedances of the converters calculated in such a way that the gain at the higher frequencies of the band is afforded principally by the shunt converter, while the series converter affords principally the gain at low frequencies.

Such a repeater is suitable for loaded and unloaded lines, may be easily set up at the installation since it requires only a gain adjustment, and provides very low distortions in the signalling pulses in direct current, since no matching networks are employed for the coupling to the line.

Advantageously, the means for producing the variation in the conversion ratios of the said series and shunt converters comprise two potentiometers, with step by step or continuous variation, or two variable resistors, with step by step or continuous variation, or two sets of fixed resistors which may be adjusted by means of straps.

According to a first embodiment of the invention, the repeater comprises also a first transformer with two primary windings connected in series with the line and provided with a central point, and a secondary winding in which the series converter is connected; the shunt converter is connected between said center points of the primary windings of the first transformer through a second transformer, having a primary winding in which a blocking capacitor for eliminating the direct current is connected.

According to a variant, the shunt converter is connected between said center points through a second and a third transformer, having primary windings in which blocking capacitors for eliminating the direct current are connected.

According to a second embodiment of the invention, the repeater comprise a first and a second transformer, having primary windings divided into several sections connected in series with the line wires in a balanced way, and forming two symmetrical centers to which the shunt converter is connected through a third transformer, having a primary winding in which a blocking capacitor for the direct current is connected. The series converter is the connected between one end of the secondary winding of the first transformer and one end of the secondary winding of the second transformer, the other two ends of said secondary windings being connected to each other and to ground.

According to a modified form of this embodiment the shunter converter is connected to said symmetrical centers through a third and fourth transformer, having primary windings in which blocking capacitors for the direct current are connected.

The invention relates also to the combination of a two wire telephone line and a repeater according to the invention, in which the transducer gain is adjusted by varying the conversion ratios of the converters of the repeaters, and the impedance matching is obtained by connecting to each converter a network of fixed load impedances chosen on the basis of the characteristic impedance of the line.

The invention will become more apparent from the accompanying drawings, which show some preferred embodiments of the invention given by way of non limiting examples. In the drawings.

Figure 1:
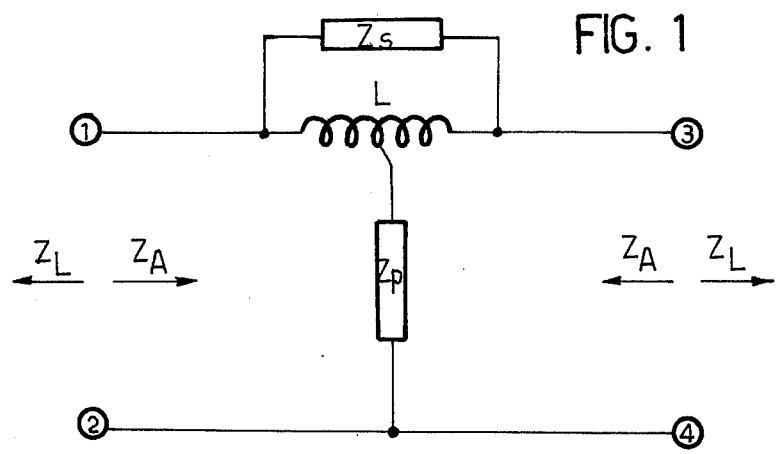
FIG. 1 is the equivalent circuit of a generic negative impedance repeater, comprising one series converter and one shunt converter.

As shown in FIG. 1, a generic negative impedance repeater comprises a series converter, which is connected across an inductor L connected in series with one wire of the line and is shown by its impedance $Z_s$, whose real component must be $\leq 0$, and a shunt converter, connected to the center of the inductor L and shown by its impedance $Z_p$, also with real component $\leq 0$.

In the drawing the arrows $Z_A$ and $Z_L$ represent respectively the characteristic impedances of the repeater and the line portions to be amplified, and references 1, 2, 3, 4 show the line terminals of the repeater.

By a device such as that of FIG. 1, the matching between the characteristic impedances $Z_A$ of the repeater and $Z_L$ of the line portions to be amplified is obtained if the well known condition $$Z_L = Z_A = \sqrt{Z_s \cdot Z_p} \tag{1}$$

is satisfied.

The (complex) image transducer gain is $$H = g + j\beta = \log_e \frac{1 + \frac{1}{2}\sqrt{Z_s/Z_p}}{1 - \frac{1}{2}\sqrt{Z_s/Z_p}} \tag{2}$$

where $g$ is the image insertion gain in Nepers and $\beta$ is the image phase rotation in radians.

Figure 2:
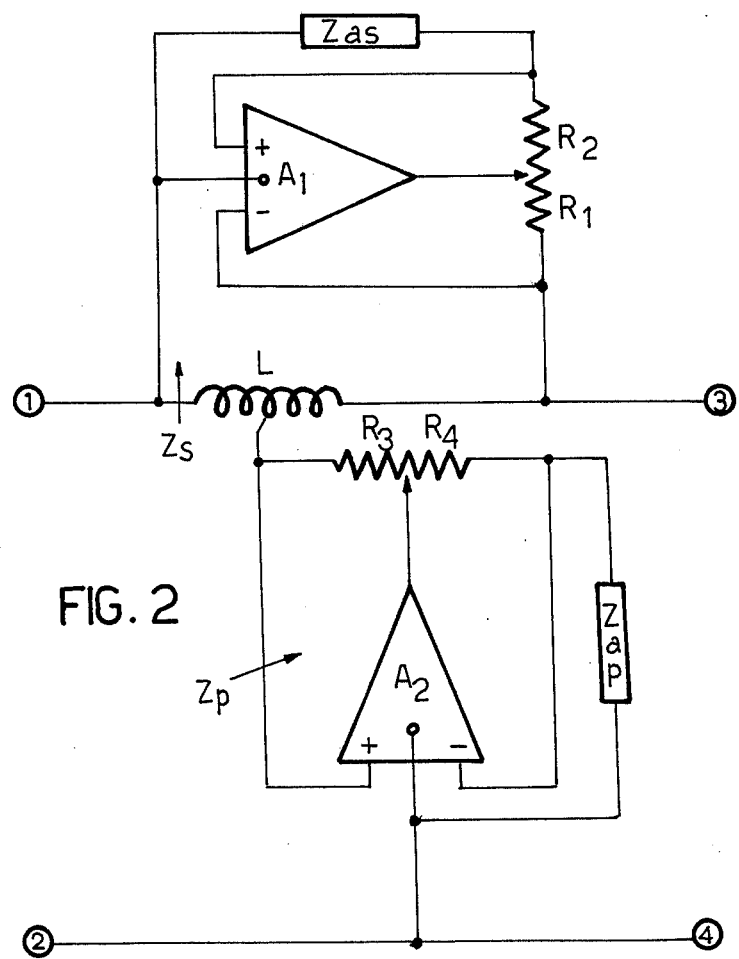
FIG. 2 is the simplified diagram of a negative impedance repeater according to the invention.

In the device of FIG. 2 the series converter comprises an amplifier $A_1$ having the output terminal connected to the slider of a potentiometer, which is therefore divided into two portions $R_1$ and $R_2$; $R_1$ is connected to one end of inductor L and to the inverting input terminal of $A_1$, shown by "−"; $R_2$ is connected to the non inverting input terminal of $A_1$, shown by "+", and to one end of an impedance $Z_{as}$, the other end of which is connected to the reference terminal of $A_1$ and to the other end of the inductor L.

The shunt converter comprises the amplifier $A_2$ whose output terminal is connected to the slider of a potentiometer, which is therefore divided into two portions $R_3$ and $R_4$; $R_3$ is connected to the center of the inductor L and to the non inverting input terminal of $A_2$, shown by "+"; $R_4$ is connected to the inverting input terminal of $A_2$, shown by "−" and to one end of an impedance $Z_{ap}$; the other end of $Z_{ap}$ is connected to the reference terminal of $A_2$ and to the line terminals 2 and 4 of the repeater. The other line terminals 1 and 3 are connected to the ends of the inductor L.

It is assumed that $A_1$ and $A_2$ are ideal amplifiers, with infinite gain, null input current, null differential input voltage, and null output impedance.

The actual amplifiers approach these characteristics so as to make sufficiently approximate the calculations made according to the above hypotheses. Also inductor L is assumed to be ideal, i.e., having infinite inductance, zero resistance, and coupling factor between the two halves into which it is divided by the central point equal to 1. Normally this inductor is replaced by windings of transformers having characteristics which considerably approach the ideal characteristics.

With reference to FIG. 2 and to the above hypotheses, it is known that the impedance of the series converter is:

$$Z_s = -\frac{R_1}{R_2} Z_{as} \tag{3}$$

The conversion ratio $N_s$ of the series converter is:

$$N_s = -\frac{R_2}{R_1} \tag{4}$$

If $R_2/R_1$ is variable, also $N_s$ will be variable and independent from the frequency.

The impedance and the conversion ratio of the shunt converter are $$Z_p = -\frac{R_3}{R_4} Z_{ap} \tag{5}$$

and respectively $$N_p = -\frac{R_4}{R_3} \tag{6}$$

If $R_4/R_3$ is variable, also $N_p$ will be variable and independent from the frequency.

As regards the matching, by applying expression (1), it is obtained:

$$Z_L = \sqrt{\frac{Z_{as}}{N_s} \cdot \frac{Z_{ap}}{N_p}} \qquad (7)$$

If $R_2/R_1$ and $R_4/R_3$ are varied so that the product $N_s \cdot N_p$ is always equal to a constant $K^2$, we have:

$$\frac{R_2}{R_1} \cdot \frac{R_4}{R_3} = K^2 = \text{constant} \qquad (8)$$

whereby $$Z_L = \sqrt{\frac{Z_{as} \cdot Z_{ap}}{K}} \qquad (9)$$

that is, in these conditions, the conversion ratios do not affect the matching, which depends only upon the load impedances $Z_{as}$ and $Z_{ap}$.

The gain will be $$H = \log_e \frac{1 + \tfrac{1}{2}\sqrt{\frac{Z_{as}}{N_s} \cdot \frac{N_p}{Z_{ap}}}}{1 - \tfrac{1}{2}\sqrt{\frac{Z_{as}}{N_s} \cdot \frac{N_p}{Z_{ap}}}} \qquad (10)$$

Being $N_s \cdot N_p = K^2 = $ constant, we have:

$$H = \log_e \frac{1 + \tfrac{1}{2}\frac{N_p}{K}\sqrt{\frac{Z_{as}}{Z_{ap}}}}{1 - \tfrac{1}{2}\frac{N_p}{K}\sqrt{\frac{Z_{as}}{Z_{ap}}}} \qquad (11)$$

This shows that the gain may be adjusted by varying the conversion ratios according to the aforesaid law, without affecting the matching.

It is also to be noted that each of the potentiometers $R_1 - R_2$ and $R_3 - R_4$ may be replaced by a fixed and a variable resistor without modifying the above discussion.

From the above description it results that the repeater has its ends an impedance $Z_L$ which is independent from the gain adjustment, depending only upon the two networks $Z_{as}$ and $Z_{ap}$ and a constant $K$.

The gain adjustment is obtained by varying the conversion ratio of each converter by acting only upon two resistors, external to the networks of load impedances $Z_{as}$ and $Z_{ap}$.

In the case of un-loaded lines, in which the regulations shall be such that the product of the two conversion ratios $N_s$ and $N_p$ increase with increasing gain of the repeater, and this requires that $N_p$ increase more quickly than $N_s$ decreases — and this to obtain a higher increase in the gain at the high frequencies of the band — there will be unavoidably a change of impedance of the repeater.

However, it is possible, by adapting the passive load-impedances $Z_{as}$ and $Z_{ap}$ that the matching on a resistive load, for instance 600$\Omega$ of the unit line plus repeater be better than the matching of the line alone.

The form of the curve giving the variation of $N_s$ and $N_p$ changes when changing the characteristic impedance of the line, but it may be predetermined by way of experiment for each type of line, and plotted on graphs.

Figure 3:
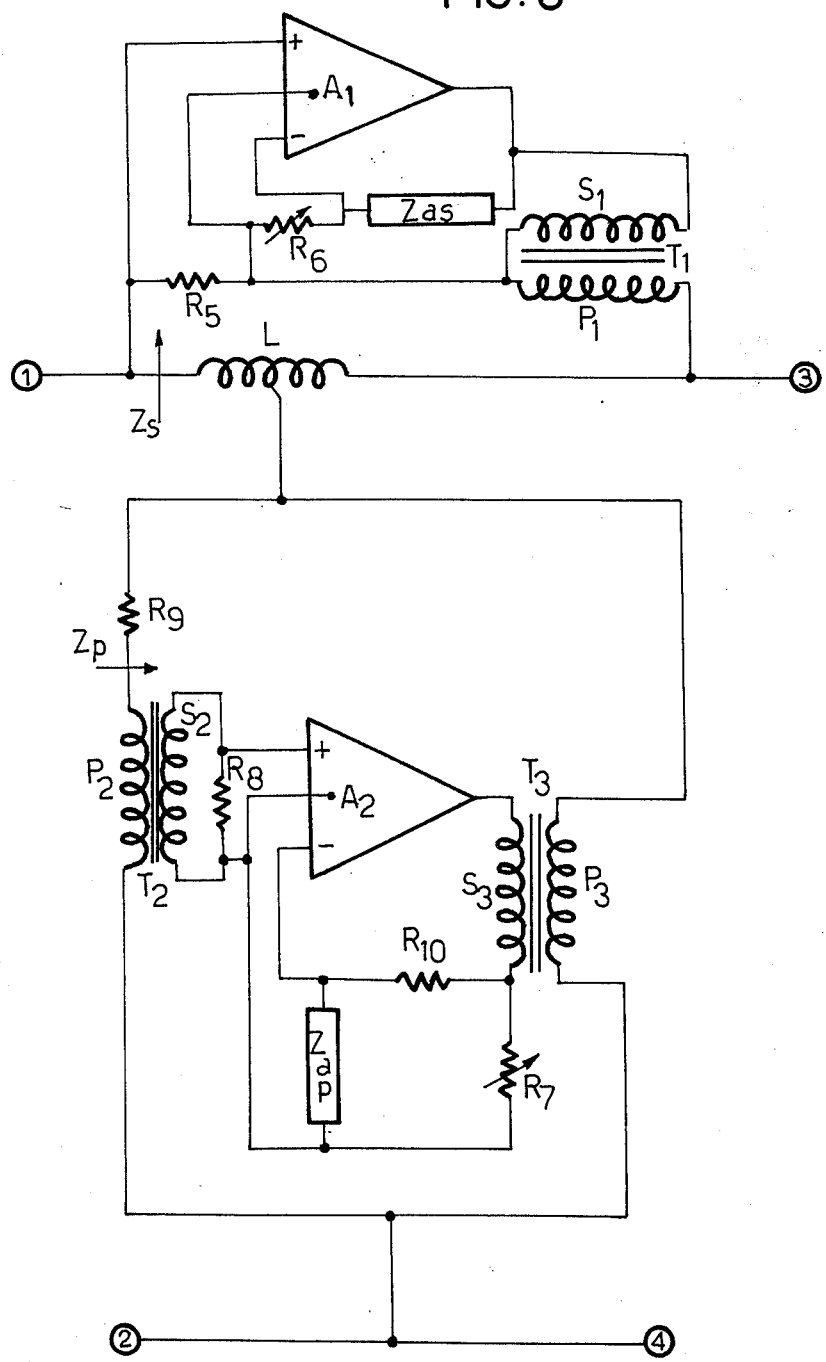
FIG. 3 is a simplified diagram of another negative impedance repeater according to the invention.

In FIG. 3 the series converter comprises an amplifier $A_1$ having the output connected to one end of the secondary winding $S_1$ of the transformer $T_1$ and to one end of an impedance $Z_{as}$.

The other end of $Z_{as}$ is connected to the inverting input terminal of the amplifier $A_1$ which terminal is in turn connected to the reference terminal through a variable resistor $R_6$. Also the other end of the winding $S_1$ of transformer $T_1$ is connected to the reference terminal.

The primary winding $P_1$ of $T_1$ is connected on one side to one end of the inductor L, and on the other side to a resistor $R_5$, which is in turn connected to the other end of L and to the non inverting input terminal of the amplifier $A_1$. The common point of $P_1$ and $R_5$ is connected to the reference terminal of $A_1$.

The shunt converter comprises the amplifier $A_2$, having the output connected to one end of the secondary winding $S_3$ of the transformer $T_3$; the other end of said winding is connected to the variable resistor $R_7$ and to resistor $R_{10}$. The other ends of $R_7$ and $R_{10}$ are connected to the impedance $Z_{ap}$, of which the end connected to $R_{10}$ is also connected to the inverting input terminal of $A_2$, and the end connected to $R_7$ is also connected to the reference terminal always of $A_2$. The center of the inductor L is connected to one end of the primary winding $P_3$ of $T_3$ and to one end of the primary winding $P_2$ of another transformer $T_2$, having a resistor $R_9$ in series; the two other ends of the windings $P_2$ of $T_2$ and $P_3$ of $T_3$ are connected together and to the line terminals 2 and 4.

The other line terminals 1 and 3 are connected to the ends of the inductor L.

The secondary winding $S_2$ of $T_2$, which has in parallel a resistor $R_8$, is connected on one side to the non inverting terminal of $A_2$ and on the other side to the reference terminal of $A_2$.

The hypotheses made in connection with FIG. 2 are still valid for the amplifiers $A_1$ and $A_2$.

If the transformers $T_1$, $T_2$, $T_3$ have all a ratio 1:1, the conversion ratio of the series converter is:

$$N_s = -\frac{R_6}{R_5}$$

If $R_6$ is variable, also $N_s$ will be variable and independent from the frequency.

For the shunt converter, the admittance at the input terminal may be considered as given by:

$$Y_p = -\frac{R_8}{R_9 Z_{ap}} \left( \frac{R_{10} + Z_{ap}}{R_7} + 1 \right) + \frac{1}{R_9} \qquad (12)$$

If $|Z_{ap}| \ll R_{10}$, if $1/R_9$ is negligible with respect to the other terms, and if $R_{10}/R_7 \gg 1$, the input admittance becomes:

$$Y_p = -\frac{R_8 R_{10}}{R_9 R_7} Y_{ap} \qquad (13)$$

and consequently the impedance and the conversion ratio will be $$Z_p = -\frac{R_7 R_9}{R_8 R_{10}} Z_{ap} \qquad (14)$$

and respectively $$N_p = - \frac{R_8 R_{10}}{R_7 R_9} \quad (15)$$

If $R_7$ is variable, also $N_p$ is variable and independent from the frequency.

As in the case of FIG. 2, if the product $N_s \cdot N_p$ is caused to keep constant when $R_6$ and $R_7$ are varied, it is:

$$\frac{R_6}{R_5} \cdot \frac{R_8}{R_7} \cdot \frac{R_{10}}{R_9} = K^2 = \text{constant} \quad (16)$$

The ratio $R_{10}/R_9$ is also a constant, $R_{10}$ and $R_9$ being two fixed resistors and thus we have:

$$\frac{R_6}{R_5} \cdot \frac{R_8}{R_7} = K_1^2 = \text{constant} \quad (17)$$

Such an expression is similar to expression (8), and therefore it is possible to repeat the considerations made in connection with FIG. 2 as regards the matching and the gain adjustment.

Figure 4:
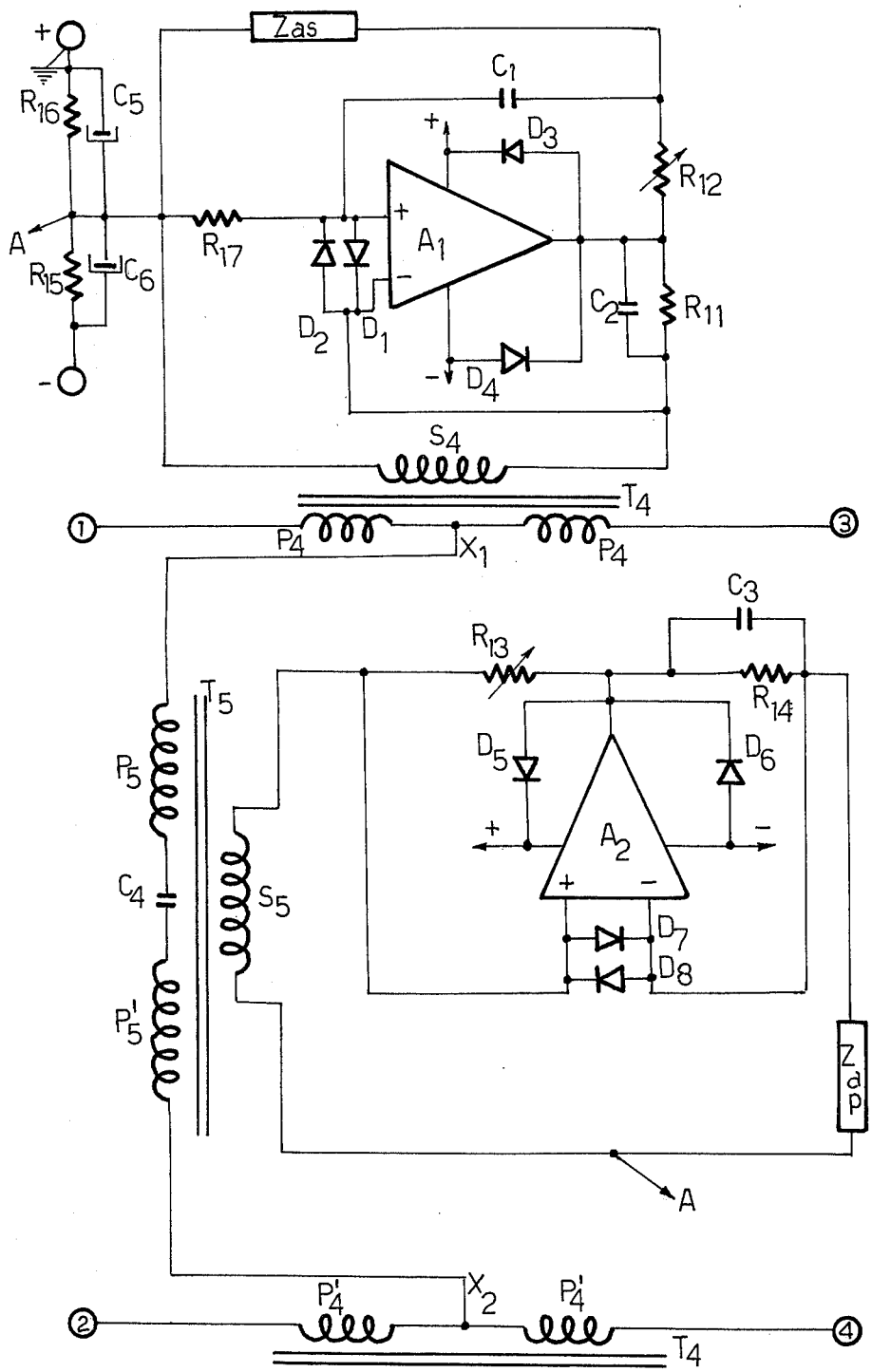
FIG. 4 is a complete circuit diagram of the repeater of FIG. 2.

FIG. 4 shows the complete circuit diagram of the repeater for two wire telephone lines, shown in a simplified way in FIG. 2.

In the practical embodiment of this Figure the amplifiers $A_1$ and $A_2$ consist of linear integrated circuits; the two branches $R_1$, $R_2$ and $R_3$, $R_4$ of the potentiometers of FIG. 2 are realized by means of one fixed resistor and one variable resistor connected in series. More particularly, the output of $A_1$ is connected to the common point of the fixed resistor $R_{11}$ and of the variable resistor $R_{12}$, and the output of $A_2$ is connected to the common point of the variable resistor $R_{13}$ and of the fixed resistor $R_{14}$. The other ends of $R_{11}$ and $R_{14}$ are connected to the inverting inputs of amplifiers $A_1$ and $A_2$ and the other ends of $R_{12}$ and $R_{13}$ are connected to the non inverting inputs of said amplifiers $A_1$ and $A_2$.

The inductor L is realized by means of the winding of a transformer $T_4$, to the secondary $S_4$ of which is connected the series converter. $T_4$ has two primary windings $P_4$, $P_4'$ connected respectively between the line terminals 1, 3 and 2, 4 of the repeater, and having respective central points $X_1$ and $X_2$, to which the shunt converter is connected through a second transformer $T_5$.

The transformer $T_4$, besides providing for the insulation, allows also to connect the repeater in the line in a balanced way, and to connect the shunt converter in two symmetrical points.

FIG. 4 shows also that the amplifiers $A_1$, $A_2$ are provided with diodes for protection against overvoltages coming from the line.

In the series converter such a protection is provided by the diodes $D_1$, $D_2$ connected in opposite orientation between the inverting and the non inverting inputs of $A_1$, and by the diodes $D_3$, $D_4$ respectively connected between the output of $A_1$ and either pole of the voltage supply; for the shunt converter the protection is provided by the diodes $D_5$, $D_6$, connected like the diodes $D_3$, $D_4$, and by the diodes $D_7$, $D_8$ connected like the diodes $D_1$, $D_2$.

Moreover, in the series converter, a capacitor $C_1$ is provided in the connection between $R_{12}$ and the non inverting input of $A_1$, and serves to block the positive feedback in direct current. A second capacitor $C_2$ is connected in parallel with $R_{11}$ in order to compensate the unavoidable phase displacement produced by $A_1$ at the high frequencies, thereby eliminating the possible rising of oscillations.

As regards the shunt converter, the transformer $T_5$ has a secondary winding $S_5$, in which the shunt is connected, and a primary the ends of which are connected to the central points $X_1$, $X_2$ of $T_4$ and which is divided into two sections $P_5$, $P_5'$ by a capacitor $C_4$ which has to block the d.c. components possibly existing on the line. A further capacitor $C_3$ is connected in parallel with resistor 14 in order to compensate the unavoidable phase displacement generated by $A_2$ at the high frequencies, thereby eliminating the possible rising of oscillations.

The drawing shows also the biasing circuit for both series and shunt converters, which comprises the resistors $R_{15}$ and $R_{16}$ connected in series between the negative pole and the grounded positive pole of a voltage supply, the two capacitors $C_5$ and $C_6$, in parallel with $R_{16}$ and respectively with $R_{15}$ and a further resistor $R_{17}$, connected between the common point of $R_{15}$, $R_{16}$, $C_5$ and $C_6$ and the non inverting input of $A_1$.

Such a point of the biasing circuit is also connected with the common end of $S_5$ and $Z_{ap}$ in the shunt converter (arrows A).

In a circuit such as that above, if the transformation ratio of $T_4$ and $T_5$ is equal to 1, the considerations made in connection with the theoretical circuit of FIG. 2 may be applied with a sufficient approximation.

Figure 5:
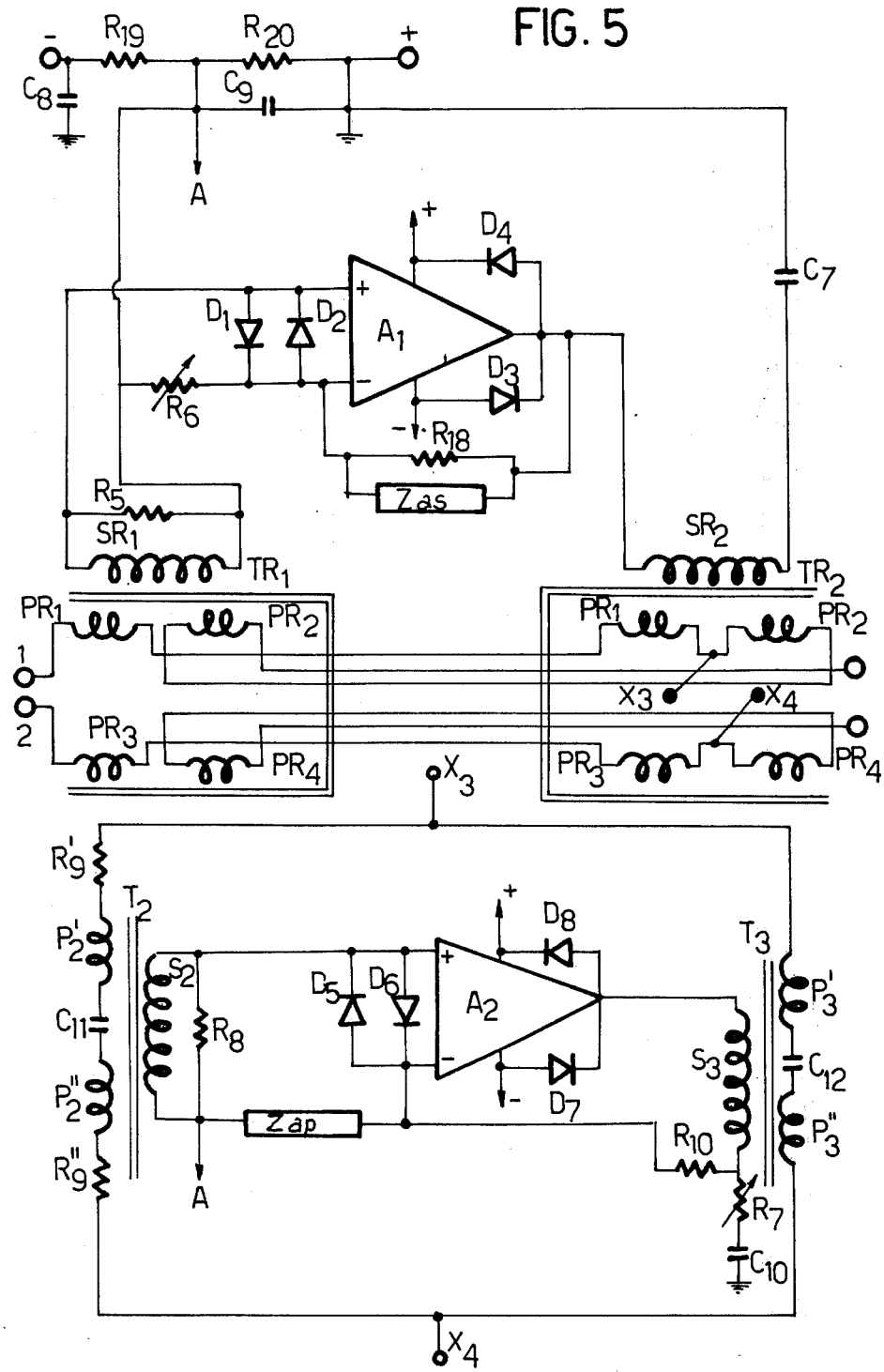
FIG. 5 is a complete circuit diagram of the repeater of FIG. 3.

FIG. 5 shows the complete circuit diagram of the repeater schematically shown in FIG. 3.

In the circuit of FIG. 5, the resistors $R_5$, $R_6$, $R_7$, $R_8$, $R_9$, $R_{10}$, and the impedances $Z_{as}$, $Z_{ap}$ are the same as in FIG. 3, except that one end of $R_7$ is grounded and the resistor $R_9$ comprises two equal sections $R_9'$, $R_9''$. Also in this embodiment of the invention the amplifiers $A_1$, $A_2$ are realized by means of linear integrated circuits, and are provided with the diodes $D_1 - D_4$ and $D_5 - D_8$ for protection against overvoltages, connected as it has been described with reference to FIG. 4.

The inductor L and the transformer $T_1$ of the series bipole are realized by means of two transformers $TR_1$, $TR_2$, of which the primary windings are interconnected and divided into a plurality of sections $PR_1$, $PR_2$, $PR_3$, $PR_4$ connected in series with the line wires in a balanced way, and the secondary windings $SR_1$, $SR_2$ have a common end (for the alternating currents) which is also grounded, and the other end connected to the non inverting input and respectively to the output of $A_1$. The primary windings $PR_1$, $PR_2$, $PR_3$, $PR_4$ have also the symmetrical central points $X_3$ and respectively $X_4$, which allow the connection of the shunt converter through transformers $T_2$ and $T_3$.

A capacitor $C_7$ is connected between $SR_2$ and the ground, and, together with the resistor $R_{18}$ in parallel with $Z_{as}$, provides for the negative feedback in direct current to $A_1$ even in the case that $Z_{as}$ does not have ohmic continuity.

As regards the shunt converter, the transformers $T_2$, $T_3$ have their primary windings divided into two sections $P_2'$, $P_2''$ and respectively $P_3'$, $P_3''$, by the capacitors $C_{11}$ and respectively $C_{12}$ which have to block the direct current possibly present on the telephone line.

The ends of $P_2'$ and $P_2''$ not connected to $C_{11}$ are connected to the resistors $R_9'$ and respectively $R_9''$. A further capacitor $C_{10}$ is connected between $R_7$ and the ground, in order to provide for the negative feedback in direct current to the amplifier $A_2$.

The drawing shows also the biasing circuit for both series and shunt converters, comprising the resistors $R_{19}$ and $R_{20}$ connected in series between the negative pole and the grounded positive pole of the voltage supply, the capacitor $C_8$, connected between the said negative pole and the ground, and the capacitor $C_9$ in parallel with $R_{20}$. The common point of $R_{19}$ and $R_{20}$ is connected to the common ends of $SR_1$, $R_5$, $R_6$ in the series converter, and to the common ends of $S_2$, $R_8$, $Z_{ap}$ in the shunt converter (arrows A).

For a circuit such as that described above, if the transformation ratios of $TR_1$, $TR_2$, $T_3$ are equal to 1, the considerations made in connection with FIG. 3 may be applied with sufficient approximation.

It is self evident that the diagrams of FIGS. 4 and 5 are given only as non limiting examples, and that the series and shunt converter shown therein may be coupled in a different way.

Thus for instance the transformer $T_4$ of FIG. 4 may be replaced by two transformers like $TR_1$, $TR_2$ of FIG. 5, the series converter being then connected between the secondary windings of said transformers, and the shunt converter being still connected to the line through a single transformer, such as transformer $T_5$.

In another variant, the connection between the series converter and the line may be still realized by means of a single transformer, similar to $T_4$, and the shunt converter may be connected to the points $X_1$, $X_2$ through two transformers, like transformers $T_2$ and $T_3$ of FIG. 5.

Further, the variable resistors $R_{12}$, $R_{13}$ of FIG. 4 and $R_6$, $R_7$ of FIG. 5 may be replaced by potentiometers with step by step or continuous variation, or by sets of fixed resistors which may be cut in by displacing straps.

It is also possible to use series and shunt converters with different designs, provided that they have a conversion ratio which is variable and independent from the frequency, and networks of fixed load impedances.

The networks of load impedances depend upon the characteristic impedances of the line to be amplified, and therefore the network for a given kind of line serves for all lines having the same nominal characteristic impedances.

The networks may be determined during the planning by theoretically calculating the values of the parameters and by experimentally adjusting said values; the so determined networks may be realized in the factory and kept at the installing staff's disposal. In practice the allowed tolerances for the characteristic impedances of the line may cause a mismatching of the repeater which in some cases cannot be neglected; in these cases at the installation the values of the two resistors which regulate the conversion ratios of the series and shunt converters will be slightly changed independently from each other, so as to obtain small variations of the impedance of the repeater and consequently a better matching.

By the theoretical — experimental method also the gain, which may be obtained in the various cases of amplification practically occurring, is predetermined leaving suitable margins of stability in order to take into account the differences between the various lines and the variations in the attenuation of the lines due to changes in the temperature. In this way the installing staff has only to choose and to connect in the repeater the networks corresponding to the kind of line to be amplified, to bring the gain, by acting on the two variable resistors, to the value which may be obtained in the specific case of amplification. The value to be given to each of the two variable resistors may be deduced from graphs derived from the graphs concerning the variation of the conversion ratios as a function of the gain.

What is claimed is:

1. A negative impedance repeater for amplification of loaded or non-loaded telephone lines operating at voice frequency comprising:

a first open circuit stable one-port network, the terminals of which are the input terminals of a negative impedance converter, the output of which is loaded by a preset passive impedance network, chosen in relation to the characteristic impedances of the line section to be amplified;

a second short circuit stable one-port network, the terminals of which are the input terminals of a negative impedance converter, the output of which is loaded by a preset passive impedance network, chosen in relation to the characteristic impedances of the line section to be amplified;

adjusting means in each of said converters, and external to said impedance networks, for adjusting the feedback and consequently the conversion ratio;

said adjusting means being independent from each other and being manually varied on the basis of predetermined conversion ratio curves such that:

in the case of loaded lines, the product of the two conversion ratios remains constant over the entire variation range; to provide a gain adjustment which does not affect the repeater impedance and in the case of non-loaded lines, the conversion ratio of the converter included with the short circuit stable network increases quicker than the conversion ratio of the converter included within the open circuit stable network decreases, to provide a gain adjustment which increases more quickly at the high frequencies than at the low frequencies of the transmitted band, so that an equalization, necessary for this type of lines is introduced, and, coupling means for coupling said converters to the line to be amplified.

2. A repeater according to claim 1, wherein each of said adjusting means of the conversion ratios is a variable resistor connected in the feedback circuit of one of said negative impedance converters.

3. A repeater according to claim 1, wherein the passive impedance networks forming the load of each converter and determining the repeater characteristic impedance, are performed, are of the plug in type, and can be changed according to the type of line to be amplified.

* * * * *